United States Patent
Nakanishi

(10) Patent No.: US 7,581,823 B2
(45) Date of Patent: Sep. 1, 2009

(54) PIEZOELECTRIC FILM ELEMENT, METHOD OF MANUFACTURING THE SAME, AND LIQUID DISCHARGE HEAD

(75) Inventor: Koichiro Nakanishi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 429 days.

(21) Appl. No.: 11/007,318

(22) Filed: Dec. 9, 2004

(65) Prior Publication Data

US 2005/0128255 A1    Jun. 16, 2005

(30) Foreign Application Priority Data

Dec. 15, 2003    (JP)    ............... 2003-416003

(51) Int. Cl.
- B41J 2/045    (2006.01)
- H01L 41/00    (2006.01)
- H02N 2/00    (2006.01)

(52) U.S. Cl. .................. 347/68; 347/70; 310/321

(58) Field of Classification Search ............ 347/70, 347/71
See application file for complete search history.

(56) References Cited

U.S. PATENT DOCUMENTS

| 5,825,121 | A |  | 10/1998 | Shimada |  |
|---|---|---|---|---|---|
| 6,149,968 | A |  | 11/2000 | Shimada |  |
| 6,992,420 | B2 | * | 1/2006 | Jang et al. | ............ 310/324 |
| 7,053,526 | B2 |  | 5/2006 | Unno et al. |  |
| 7,069,631 | B2 |  | 7/2006 | Unno et al. |  |
| 2006/0246734 | A1 | * | 11/2006 | Blalock et al. | ............ 438/725 |
| 2007/0128273 | A1 | * | 6/2007 | Miura et al. | ............ 424/464 |

FOREIGN PATENT DOCUMENTS

| CN | 1380187 A |  | 11/2002 |
|---|---|---|---|
| EP | 1231061 A1 | * | 8/2002 |
| JP | 8-78748 |  | 3/1996 |
| JP | 10-95111 |  | 4/1998 |
| JP | 11163428 A | * | 6/1999 |
| JP | 2003-309303 |  | 10/2003 |

OTHER PUBLICATIONS

*Note: Counterpart U.S. Patents also cited (see body of IDS).

* cited by examiner

*Primary Examiner*—Matthew Luu
*Assistant Examiner*—Lisa M Solomon
(74) *Attorney, Agent, or Firm*—Fitzpatrick, Cella, Harper & Scinto

(57) ABSTRACT

A porous layer composed of porous silicon, and the like is formed by anodization and the like on a substrate acting as a vibration sheet of, for example, a liquid discharging head, and a single crystal thin film is epitaxially grown on the porous layer. A lower electrode, a piezoelectric film, and an upper electrode are laminated on the single crystal thin film, and the piezoelectric film is made to a single crystal or a highly oriented polycrystal by a heat treatment. Stress caused by a difference between the thermal expansion coefficient of the substrate and that of the piezoelectric film can be eased by interposing the porous layer therebetween.

6 Claims, 4 Drawing Sheets

PIEZOELECTRIC FILM ELEMENT, METHOD OF MANUFACTURING THE SAME, AND LIQUID DISCHARGE HEAD

BACKGROUND OF THE INVENTION

1. Field of the Invention

The present invention relates to a piezoelectric film element, which is applied to a liquid discharging head of a liquid discharge recording apparatus such as an ink jet printer, and the like, a sound generating body such as a microphone, a speaker, and the like, various vibrators and oscillators, and further a drive unit, and the like for various sensors, to a method for manufacturing the piezoelectric film element as well as to a liquid discharge head.

2. Related Background Art

Heretofore, a piezoelectric film element using a dielectric thin film (piezoelectric film) having a piezoelectric property is widely used in sensors and actuators as an energy transforming element for transforming electric energy to mechanical energy. In particular, recently, there is a piezoelectric actuator of a liquid discharging head mounted on an ink jet printer, and the like as a distinguishing example to which the piezoelectric film element is applied.

The piezoelectric film element of the piezoelectric actuator of the liquid discharging head is generally composed of a piezoelectric film and an upper electrode and a lower electrode disposed across the piezoelectric film. As a component of the piezoelectric film, there are known a two-component composition mainly containing lead zirconate titanate (PZT) or a three-component composition prepared by adding a third component to the two components. Further, as a method for manufacturing the piezoelectric film, a sputtering method, a sol-gel method, a CVD method, and the like are used.

Japanese Patent Application Laid-Open No. H8-078748 discloses a piezoelectric film mainly containing PZT and an ink jet recording head.

FIG. 5 shows a film configuration of an ordinary piezoelectric film element disclosed in Japanese Patent Application Laid-Open No. H8-078748, in which the piezoelectric film element has a silicon substrate 101 as a substrate, a silicon thermal oxidized film 102, a lower electrode 103, a piezoelectric film 104, and an upper electrode 105, a close contact layer 105a is interposed between the upper electrode 105 and the piezoelectric film 104, and a close contact layer 103a is interposed between the lower electrode 103 and the piezoelectric film 104.

Although recent ink jet printers achieve image quality comparable with the quality of photographs, there are more increased needs of users for requiring a further improvement in image quality and an improvement in a print speed. To cope with these needs, a large amount of displacement as well as low power consumption and reduction in size are required for the piezoelectric actuator of the liquid discharge recording apparatus. Accordingly, it is desired to develop a piezoelectric film having higher piezoelectric characteristics. To obtain a good piezoelectric constant, a piezoelectric film must be ordinarily subjected to a heat treatment at a temperature from 500° C. to 700° C. or more. However, a conventional piezoelectric film element is made by laminating a silicon substrate, a piezoelectric film, a lower electrode, an upper electrode, and the like having a different thermal expansion coefficient laminated as shown in FIG. 5. Accordingly, stress is generated because they are thermally expanded differently in the heat treatment process described above due to a difference between their thermal expansion coefficients, thereby the piezoelectric property of the piezoelectric film is deteriorated, and cracks and the like occur. When the substrate is composed of a material having the same thermal expansion coefficient as that of the piezoelectric film, stress applied to the piezoelectric film can be reduced. However, a problem arises in that a material that can be used for the substrate and a manufacturing process are greatly limited. Further, stress can be also reduced by making the thickness of the substrate approximately equal to or less than that of the piezoelectric film. However, since the thickness of the piezoelectric film is made to several micrometers to several tens of micrometers, this is not practical although not impossible because handling is very difficult.

As an idea for reducing stress, Japanese Patent Application Laid-Open No. H10-095111 proposes a structure in which a lower electrode is composed of at least two metal film layers and the metal film particles of a first layer is made smaller than those of a second layer. With the above configuration, since the lower electrode curls in a direction opposite to that of a substrate, stress to a piezoelectric film can be reduced.

However, in the film configuration disclosed in Japanese Patent Application Laid-Open No. H10-095111, the thickness of the lower electrode must be made equal to or less than that of the piezoelectric film at least when the piezoelectric film is used as an actuator, and the thickness is ordinarily 0.5 μm or less. In contrast, since the thickness of the substrate is ordinarily 400 μm or more, it is contemplated that an effect for reducing the influence of thermal stress of the substrate by the lower electrode is small.

SUMMARY OF THE INVENTION

An object of the present invention made in view of the unsolved problems of the conventional technologies is to provide a piezoelectric film element, which reduces stress generated by a difference between the thermal expansion coefficients of a substrate and a piezoelectric film by interposing a porous layer between the substrate and the piezoelectric film of an piezoelectric film element and which suppresses deterioration of the performance of the piezoelectric film and occurrence of exfoliation, cracks, and the like in a manufacturing process to thereby contribute to enhance the performance of a liquid discharging head, and the like, to increase the density thereof and to reduce the cost thereof, a method for manufacturing the piezoelectric film element, and the liquid discharging head.

To achieve the above object, a piezoelectric film element of the present invention includes a substrate, a porous layer formed on the substrate, a single crystal or single-oriented thin film formed on the porous layer, and a piezoelectric film formed on the thin film.

It is preferable that the substrate be composed of silicon and the porous layer be composed of porous silicon.

It is preferable that an oxide film layer be interposed between the piezoelectric film and the thin film.

A method for manufacturing a piezoelectric film element of the present invention includes a porous layer forming step of forming a porous layer on a substrate, a step of epitaxially growing a single crystal thin film on the porous layer, and a step of forming a piezo electric film on the thin film.

It is preferable that the porous layer forming step be a step of forming the porous layer by anodizing a surface of the substrate.

It is preferable to interpose a conductive layer between the piezoelectric film and the thin film.

A liquid discharging head for pressurizing a liquid in pressure generating chambers by a piezoelectric drive force and discharging the liquid from discharging ports includes a flow path substrate on which the pressure generating chambers are disposed, a vibration sheet disposed on the flow path substrate in correspondence to the pressure generating chambers, a porous layer formed on the vibration sheet, a single crystal or single-oriented thin film formed on the porous layer, a piezoelectric film formed on the thin film, and electrodes for supplying power to the piezoelectric film.

The single crystal thin film for making the piezoelectric film to a single crystal or to a highly oriented polycrystal is a film laminated by the epitaxial growth through the porous layer on the substrate, and the thickness of the single crystal thin film can be made equal to that of the piezoelectric film. In addition to the above, since the porous layer acts as a stress easing layer, the piezoelectric film is free from the restriction of the substrate. Accordingly, stress generated to the piezoelectric film by a difference between the thermal expansion coefficient of the piezoelectric film and that of the substrate can be greatly reduced, thereby a piezoelectric film of high quality can be obtained.

When the single crystal thin film is composed of silicon, the porous layer is composed of porous silicon, and the substrate is composed of silicon, a cost can be reduced by using silicon which is widely studied and used as a semiconductor material and a material of MEMS. Furthers a method for processing silicon is widely examined, and a wide variety of processing methods can be selected.

The oxide film layer interposed between the piezoelectric film and the single crystal thin film is useful as a prevention layer for preventing mutual diffusion when the piezoelectric film is subjected to a heat treatment. The oxide film layer is suitably employed particularly when a material containing an element such as lead and the like liable to diffuse is used as a piezoelectric material.

When a single crystal is used as the piezoelectric film, it is preferable to use a film having a high orienting property or a single crystal oxide film as the oxide film layer. It is also preferable to use the oxide film layer composed of a conductive oxide film as the electrodes. When the piezoelectric film contains any one or all of lead, titanium, and zirconium, there can be obtained a piezoelectric film excellent in a piezoelectric performance.

As described above, the piezoelectric film having an excellent performance with low stress can be formed by reducing stress applied thereto by epitaxially growing the single crystal thin film on the porous layer and disposing the piezoelectric film on the single crystal thin film.

When anodization is employed as a method for forming the porous layer, it is possible to form a porous layer having a desired density.

Using the low stress piezoelectric film of high quality, which can be manufactured stably, to the liquid discharging head, and the like will be able to contribute to enhance the fineness thereof and to reduce the cost thereof.

BRIEF DESCRIPTION OF THE DRAWINGS

FIGS. 4A and 4B show a main portion of a liquid discharging head, in which FIG. 4A is a schematic partial sectional view of the liquid discharging head, and FIG. 4B is a plan view showing patterns of a pressure generating chamber, and the like.

DESCRIPTION OF THE PREFERRED EMBODIMENTS

Figure 1:
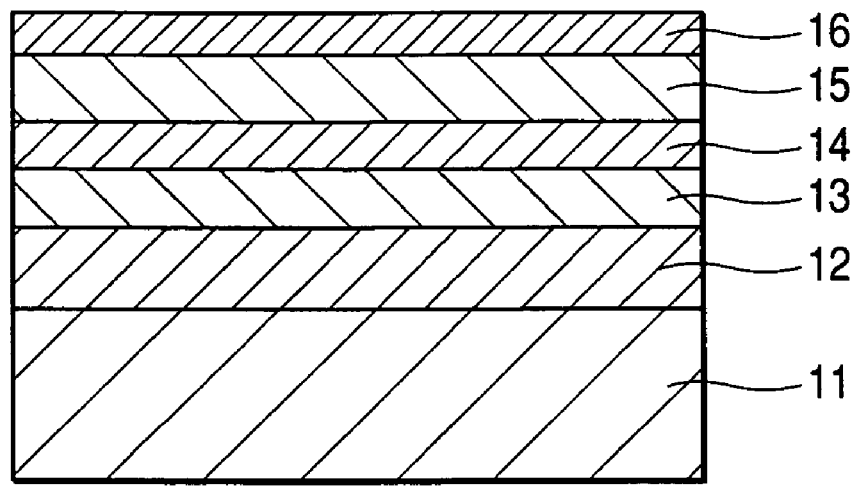
FIG. 1 is a view showing a film configuration of a piezoelectric film element according to a first embodiment.

FIG. 1 shows a film configuration of a piezoelectric film element according to a first embodiment, in which a porous layer 12 is formed on a single crystal substrate 11, a single crystal or single-oriented thin film 13 (hereinafter referred to as "single crystal thin film") is formed on the porous layer 12, and a lower electrode 14, a piezoelectric film 15 and an upper electrode 16 are sequentially formed on the single crystal thin film 13.

Figure 2:
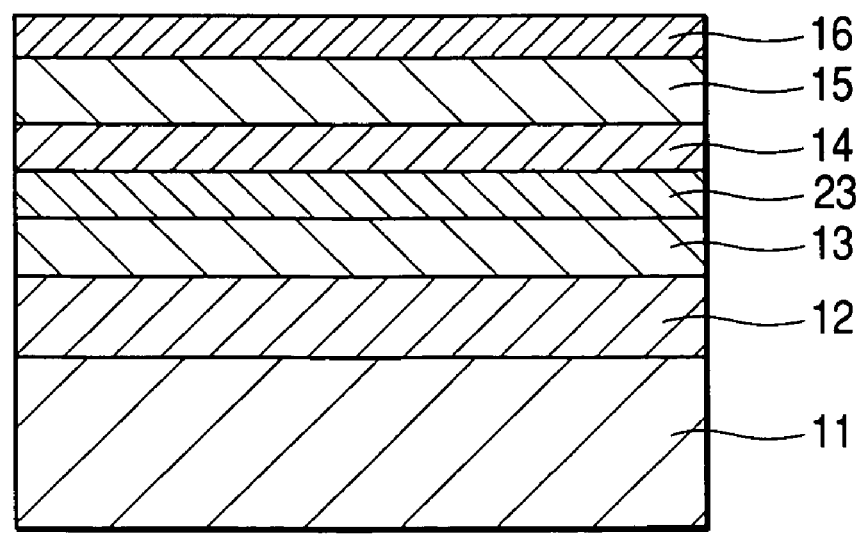
FIG. 2 is a view showing a film configuration of a piezoelectric film element according to a second embodiment.

FIG. 2 is shows a film configuration of a piezoelectric film element according to a second embodiment, in which a diffusion preventing oxide film layer 23 is interposed between a single crystal thin film 13 and a lower electrode 14. Since a substrate 11, a porous layer 12, a single crystal thin film 13, a piezoelectric film 15, and an upper electrode 16 and the lower electrode 14 that act as an electrode means are the same as those of the first embodiment, they are denoted by the same reference numerals, and the explanation thereof is not repeated.

Figure 3A:
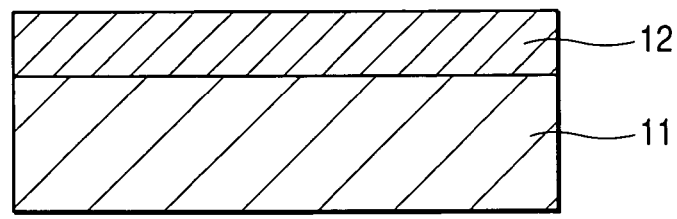
FIGS. 3A, 3B, and 3C are process views explaining a manufacturing process of the piezoelectric film element shown in FIG. 1.

A manufacturing process of the piezoelectric film element shown in FIG. 1 will be explained with reference to FIGS. 3A, 3B, and 3C. First, as shown in FIG. 3A, the porous layer 12 is formed on the substrate 11. An anodizing method, a sol-gel method, and the like can be used as a method for forming the porous layer 12. Porous silicon, porous gallium arsenide, porous alumina, porous titanium oxide, and the like can be used as a material of the porous layer 12. The porous layer 12 can be also formed of a material containing carbon or non-sintered ceramics. It is sufficient that the porous layer 12 have a thickness of several to several tens of micrometers.

Figure 3B:
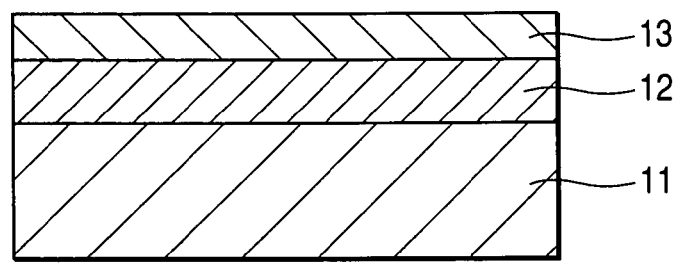

Next, as shown in FIG. 3B, the single crystal thin film 13 is formed on the porous layer 12 by epitaxial growth. Although the film thickness of the single crystal thin film 13 is determined in consideration of the material and the thickness of the piezoelectric film 15, the film thickness thereof is approximately the same as that of the piezoelectric film 15 or preferably 2 μm or less. A CVD method and a PVD method can be used as an epitaxially growing method at the time. Further, a single crystal, which is laminated on a different substrate by epitaxial growth, may be joined to the porous layer 12 and arranged as the single crystal thin film 13.

When the oxide film layer 23 is formed on the single crystal thin film 13 as shown in FIG. 2, diffusion can be prevented when an element liable to be diffused is used.

Further, the oxide film layer 23 is preferable when a film having a high orienting property and a single crystal film are used as the piezoelectric film 15. $SiO_2$, YSZ, MgO, $Al_2O_3$, $LaAlO_3$, $Ir_2O_3$, SRO, STO, etc. can be used as a material of the oxide film layer 23.

Figure 3C:
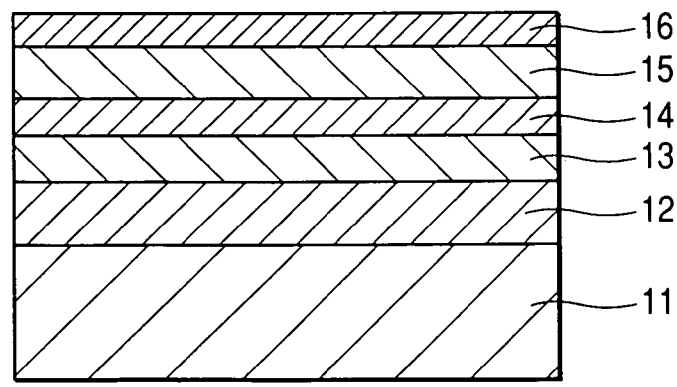

After the single crystal thin film 13 is formed, the lower electrode 14, the piezoelectric film 15, and the upper electrode 16 are sequentially formed as shown in FIG. 3C. Although a combination of a close contact layer and a metal layer, for example, a combination of a Ti film and a platinum film, a conductive oxide crystal such as $Ir_2O_3$, and the like can be used as the lower electrode 14, a preferable material is selected in consideration of a material and a manufacturing method of the piezoelectric film 15.

After the lower electrode 14 is formed, the piezoelectric film 15 is formed. Lead zirconate titanate (PZT), barium titanate, barium titanate zirconate, or these materials added with elements such as Mn, Nb, La, Ge, etc., for example, may be used as the material of the piezoelectric film 15. Further, the material may be any of a single crystal and a polycrystal. A sputtering method, a sol-gel method, a hydrothermal crystallization method, a CVD method, a laser abrasion method, a gas deposition method, and the like can be used as a method for forming the piezoelectric film 15. After the piezoelectric film 15 is formed, the upper electrode 16 is formed. A material similar to that of the lower electrode 14 can be used as a material of the upper electrode 16.

Figure 4A:
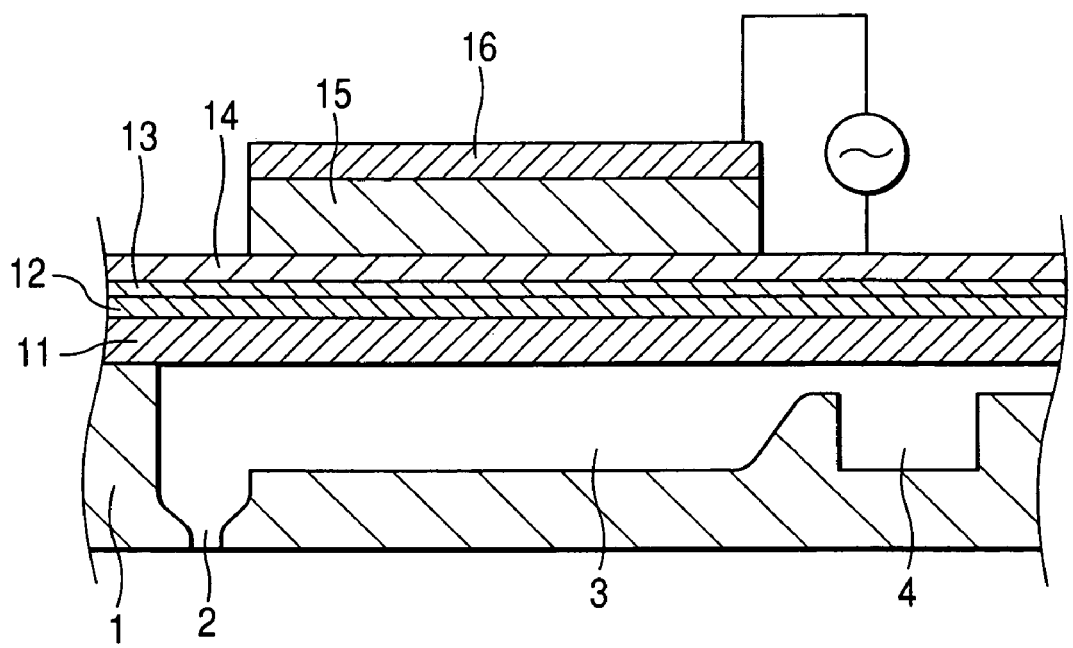
Figure 4B:
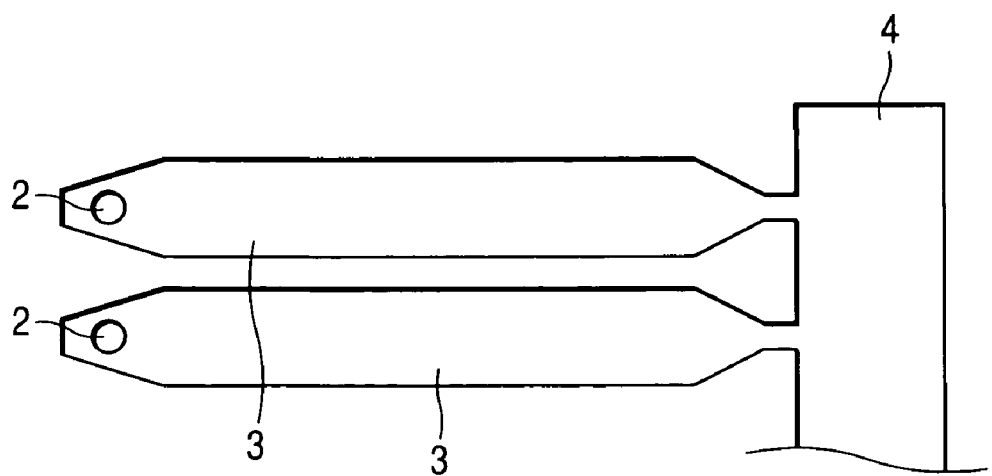
Figure 5:
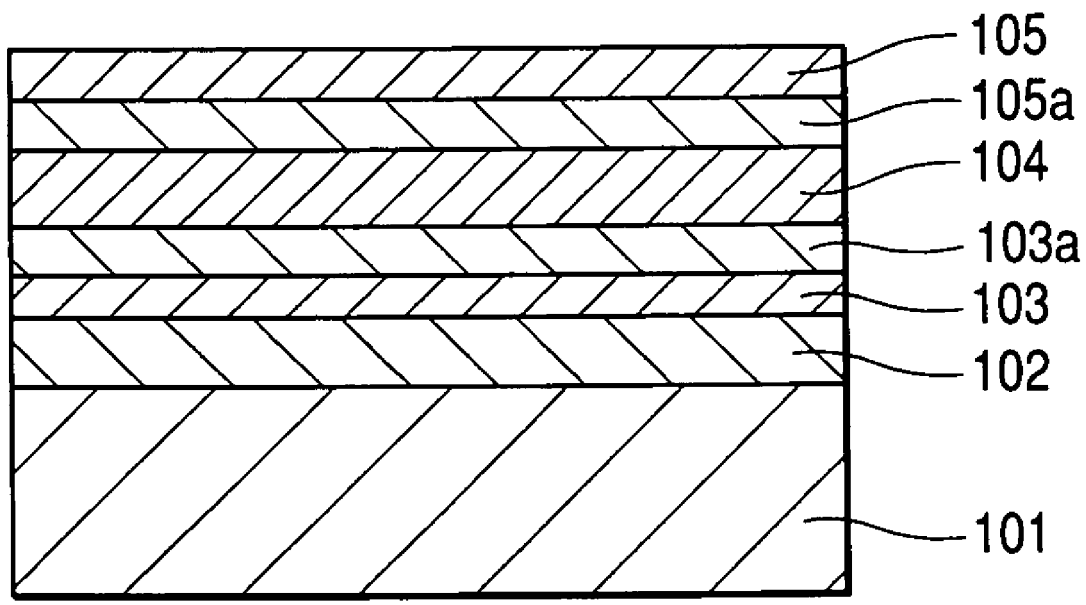
FIG. 5 is a view showing a film configuration of a piezoelectric film element according to a conventional example.

FIGS. 4A and 4B show a configuration of a liquid discharging head on which the piezoelectric film element shown in FIG. 1 can be mounted. As shown in FIG. 4A, a main body 1, which is composed of a Si substrate acting as a flow path substrate, includes grooves acting as discharging ports 2, pressure generating chambers 3, a common liquid chamber 4, and the like, the substrate 11 of the piezoelectric film element is joined to the main body 1 so as to close an upper opening of the main body 1, and the piezoelectric film 15 and the upper electrode 16 are patterned according to the shape of the pressure generating chamber 3 shown in FIG. 4B. Deforming distortion is generated to the piezoelectric film 15 by supplying drive power to the lower electrode 14 and the upper electrode 16 of the piezoelectric film element, and a liquid in the pressure generating chambers 3 is pressurized through the substrate 11 acting as a vibration sheet, thereby the liquid is discharged from the discharging ports 2.

EXAMPLE 1

According to an example 1, in a piezoelectric film element having the film configuration shown in FIG. 1, porous silicon was formed on a silicon substrate, and polycrystal PZT was formed on epitaxially grown single crystal silicon.

First, as shown in FIG. 3A, a 5-inch p-type (100) single crystal silicon substrate having a thickness of 625 μm was used as the substrate 11, and a porous silicon layer acting as a porous layer 12 was formed on the substrate 11 by anodizing the single crystal silicon substrate in a 49% HF solution. When a current density was set to 100 mA/cm$^2$, a porous layer forming speed was 8.4 μm/min, and the porous layer 12 having a thickness of 20 μm was obtained by executing the anodization for about 2.5 minutes. Next, as shown in FIG. 3B, single crystal silicon was epitaxially grown to a thickness of 2 μm on the porous layer 12 by a CVD method and arranged as a single crystal silicon thin film 13. The conditions of the epitaxial growth were as shown blow.

Gas being used: SiH$_4$/H$_2$, Gas flow rate: 0.62/140 (l/min)

Temperature: 750° C.

Pressure: 10640 Pa

Growth rate: 0.12 μm/min

Next, to prevent diffusion, the single crystal silicon thin film 13 was subjected to a heat treatment in a steam atmosphere at 1100° C., thereby a thermally oxidized film (not shown) having a thickness of 0.1 μm was formed on the single crystal thin film 13 acting as an epitaxial layer.

Subsequently, a lower electrode 14, a piezoelectric film 15, and an upper electrode 16 were sequentially formed as shown in FIG. 3C. First, as the lower electrode 14, Ti and Pt were sequentially laminated to thicknesses of 4 nm and 150 nm, respectively, by a sputtering method. Sputtering conditions were as shown below.

RF frequency: 13.56 MHz

RF power: 300 W

Sputtering pressure: 0.67 Pa

Flow rate of Ar: 30 sccm

Under the above conditions, a Ti film forming rate was about 4.8 nm/min, and a Pt film forming rate was about 14 nm/min. Next, a PZT was formed to a film having a thickness of about 3 μm by the sputtering method. The sputtering conditions of the PZT were as shown below.

RF frequency: 13.56 MHz

RF power: 200 W

Sputtering pressure: 3 Pa

Flow rate of Ar: 50 sccm

Under the above conditions, a PZT film forming rate was about 5.5 nm/min. After the PZT film was formed by the sputtering method, it was subjected to a heat treatment for five hours in an oxygen atmosphere at 700° C., thereby the piezoelectric film 15 was formed. When the PZT film having the piezoelectric property was evaluated by X-ray diffraction, it was confirmed that the PZT film was composed of a highly oriented polycrystal. Finally, Ti and Pt were sequentially laminated to thicknesses of 4 nm and 150 nm, respectively, by the sputtering method, thereby the upper electrode 16 was formed. Sputtering conditions were the same as those of the lower electrode 14.

EXAMPLE 2

According to an example 2, in a piezoelectric film element having the film configuration shown in FIG. 2, porous silicon was formed on a silicon substrate, and polycrystal PZT was formed on epitaxially grown single crystal silicon. The substrate 11 shown in FIG. 2 was composed of a 5-inch p-type (100) silicon substrate having a thickness of 625 μm, a porous layer 12 was composed of porous silicon, a single crystal thin film 13 was composed of epitaxially grown single crystal silicon, a lower electrode 14 was composed of a conductive oxide single crystal, a piezoelectric film 15 was composed of single crystal PZT, and an upper electrode 16 was formed on the piezoelectric film 15.

The p-type silicon substrate 11 was anodized in a HF solution likewise the example 1, thereby a porous layer 12 composed of porous silicon was formed. The thickness of the porous silicon layer and anodizing conditions were the same as those of the example 1. Next, a single crystal thin film 13 composed of an epitaxial single crystal (100) silicon film having a thickness of 2 μm was formed by the same manner as the example 1. Then, an oxide film layer 23 was formed by sputtering (100) YSP at 800° C., and single crystal YSZ having a thickness of 0.3 μm was formed by cooling the oxide film layer 23 at a cooling speed of 40° or more.

Thereafter, the lower electrode 14 having a thickness of 0.5 mm was formed by sputtering (111) Pt, and (111) PT and (111) PZT were sequentially formed on the lower electrode 14 at 600° C., thereby the piezoelectric film 15 having a thickness of 3.5 μm was formed. At the time, an SiO$_2$ film having a thickness of 0.02 μm was formed on the interface between the oxide film layer 23 composed of the (100) YSZ and the single crystal thin film 13 composed of the epitaxial single crystal (100) silicon film. When the crystallinity of the piezoelectric film 15 was examined by X-ray diffraction, it was confirmed that the piezoelectric film 15 was composed of single crystal PZT having 99% or more of (111) orientation. Finally, Ti and Pt were laminated to thicknesses 4 nm and 150 nm, respectively, by the same sputtering method as the upper electrode 16.

In the examples 1 and 2 described above, the porous layer formed on the substrate reduces stress generated to the piezoelectric film due to a difference between the thermal expansion coefficient of the substrate and that of the piezoelectric film.

Accordingly, exfoliation, cracks, and the like, which occur in the piezoelectric film in the manufacturing process, can be effectively prevented, thereby a piezoelectric film element having excellent piezoelectric characteristics can be stably manufactured in a high density.

Mounting the piezoelectric film element on a liquid discharging head as a piezoelectric actuator will contribute to enhance the performance of the liquid discharging head, to provide it with higher fineness and to reduce the cost thereof.

This application claims priority from Japanese Patent Application No. 2003-416003 filed Dec. 15, 2003, which is hereby incorporated by reference herein.

What is claimed is:

1. A piezoelectric film element comprising:
   a substrate;
   a porous layer formed on the substrate, the porous layer consisting of one of silicon, gallium arsenide, alumina, and titanium oxide;
   a single crystal or single-oriented thin film formed on the porous layer; and
   a piezoelectric film formed above the thin film.

2. A piezoelectric film element according to claim 1, wherein the substrate comprises silicon.

3. A piezoelectric film element according to claim 1, wherein an oxide film layer is interposed between the piezoelectric film and the thin film.

4. A liquid discharging head for pressurizing a liquid in pressure generating chambers by a piezoelectric drive force and discharging the liquid from discharging ports, the liquid discharging head comprising:
   a flow path substrate on which the pressure generating chambers are disposed;
   a vibration sheet disposed on the flow path substrate in correspondence to the pressure generating chambers;
   a porous layer formed on the vibration sheet, the porous layer consisting of one of silicon, gallium arsenide, alumina, and titanium oxide;
   a single crystal or single-oriented thin film formed on the porous layer;
   a piezoelectric film formed above the thin film; and
   electrodes for supplying power to the piezoelectric film.

5. A liquid discharging head according to claim 4, wherein the porous layer is formed by an anodizing method or a sol-gel method.

6. A piezoelectric film element according to claim 1, wherein the porous layer is formed by an anodizing method or a sol-gel method.

* * * * *